(12) United States Patent
Satoru

(10) Patent No.: US 7,271,462 B2
(45) Date of Patent: Sep. 18, 2007

(54) SOLID-STATE IMAGE SENSING DEVICE

(75) Inventor: Adachi Satoru, Ibaraki (JP)

(73) Assignee: Texas Instruments Incorporated, Dallas, TX (US)

( * ) Notice: Subject to any disclaimer, the term of this patent is extended or adjusted under 35 U.S.C. 154(b) by 143 days.

(21) Appl. No.: 10/696,018

(22) Filed: Oct. 29, 2003

(65) Prior Publication Data
US 2005/0247941 A1 Nov. 10, 2005

(30) Foreign Application Priority Data
Nov. 1, 2002 (JP) ............................. 2002-320252

(51) Int. Cl.
*H01L 27/148* (2006.01)
(52) U.S. Cl. ...................... 257/462; 257/215; 257/294; 257/E31.032
(58) Field of Classification Search ................ 257/215, 257/294, 461, 462, E31.032
See application file for complete search history.

(56) References Cited

U.S. PATENT DOCUMENTS

| | | | |
|---|---|---|---|
| 6,121,115 A * | 9/2000 | Joo et al. ..................... 438/450 |
| 6,172,729 B1 * | 1/2001 | Ikeda ......................... 349/145 |
| 6,287,886 B1 * | 9/2001 | Pan ............................. 438/57 |
| 6,466,266 B1 * | 10/2002 | Guidash et al. ............. 348/308 |
| 6,977,684 B1 * | 12/2005 | Hashimoto et al. ......... 348/294 |
| 2001/0024864 A1 * | 9/2001 | Kopley et al. .............. 438/448 |
| 2002/0022309 A1 * | 2/2002 | Dierickx ..................... 438/199 |
| 2002/0036292 A1 * | 3/2002 | Yamashita ................... 257/72 |

* cited by examiner

*Primary Examiner*—Howard Weiss
*Assistant Examiner*—John C Ingham
(74) *Attorney, Agent, or Firm*—William B Kempler; W. James Bardy, III; Frederick J. Telecky, Jr.

(57) ABSTRACT

A solid-state image sensing device that is free of kTC noise, can eliminate black smear and dark current, has a larger numerical aperture, and can eliminate the problem of insufficient area of the light-receiving portion. Photodiode PD is formed as the light-receiving portion in the formation region of first semiconductor region 15. Light is received by semiconductor layer 14 in this region, and the generated signal charge is accumulated. Semiconductor layer 12, 14, gate electrode for pixel selection 13*a*, first semiconductor region 15, second semiconductor region 16, third semiconductor region 17, etc., form transistor $Tr_1$ for pixel selection. The threshold of junction transistor $JT_1$, composed of semiconductor substrate 10, semiconductor layer 14, and second semiconductor region 16, etc., is modulated by means of the signal charge accumulated in semiconductor layer 14 in the light-receiving portion. When transistor $Tr_1$ for pixel selection is ON, a voltage modulated according to the signal charge is output.

19 Claims, 8 Drawing Sheets

SOLID-STATE IMAGE SENSING DEVICE

FIELD OF THE INVENTION

This invention pertains to a type of solid-state image sensing device. In particular, this invention pertains to a type of solid-state image sensing device, which is also known as a CMOS image sensor, manufactured in a logic process for forming a CMOS transistor (Complementary Metal Oxide Semiconductor Transistor).

BACKGROUND OF THE INVENTION

The CMOS image sensor (hereinafter to be referred to as a CMOS sensor) prepared using a CMOS logic process is also known as an APS (active pixel sensor) with an amplifier contained in the light-receiving portion of the chip.

In this system, the charge generated by light is subject to current amplification and then output from the light-receiving portion, and this enhances the image quality.

For example, the CMOS image sensor comprising of 3-5 transistors that form an amplifier for each pixel (typically, a CMOS sensor comprises four transistors) is in wide application.

In the 4-transistor CMOS sensor, however, the numerical aperture is only about 20% due to the area occupied by the amplifier in the light-receiving portion, and it is hard to further increase the numerical aperture. Also, it is hard to reduce the size of the pixels. This is undesirable. Consequently, improvement of the sensor characteristics depends significantly on forming finer elements in the CMOS process.

Also, the structure of the sensor makes impossible to realize complete evacuation of the signal charge, and the noise accompanying the reset operation, known as kTC noise is contained in the signal component. This is a major problem that hampers practical application of the sensor.

On the other hand, a novel type of CMOS sensor that includes a charge-detecting portion allowing complete evacuation of the signal charge in reset has been under development as a CMOS sensor with a light-receiving portion that allows complete evacuation. This type of CMOS sensor can realize a high image quality with zero kTC noise. Consequently, it has a latent ability and allows high-speed driving. This is an advantage.

There are several reports on the CMOS sensors with said light-receiving portion that allows complete evacuation.

As described in one report, T. Miida, et al.: "1.5M Pixel Imager with Localized Hole Modulation Method," ISSCC Digest of Technical Papers, USA, Vol. 55, February 2002, a type of CMOS sensor known as a MOS gate threshold modulation-type, and having a structure wherein charge-detecting current flows in the in-plane direction of the substrate, has been developed that has a numerical aperture of about 30%.

In use, however, the gate for charge detection and the gate for pixel selection are shared in the CMOS sensor of the MOS gate threshold modulation-type. Consequently, when an intense beam of light is incident, the source current of the unselected pixels flows out, forming a black smear. Consequently, this scheme is problematic in its concept.

Also, a type of charge-detecting portion has been developed with a structure in which the charge-detecting current flows in the depth direction (hereinafter to be referred to as the vertical direction) of the silicon wafer by means of a vertical pnp transistor (junction transistor) Japanese Kokai Patent Application No. 2002-0054225. In the following, it will be referred to as a vertical pnp transistor type sensor.

The numerical aperture of the vertical pnp transistor type sensor is about 30%, and its charge-detecting current can be higher than that of the MOS gate threshold modulation-type CMOS sensor. Consequently, the Johnson noise can be reduced significantly.

Also, because the gate for pixel selection can be separated from the charge-detecting portion, this type of sensor is preferred over the MOS gate threshold modulation-type CMOS sensor with respect to the problem of black smear.

When the sensor of the vertical pnp transistor type is adopted as a CMOS sensor, however, contact is necessary in the source/drain region for flow of the charge-detecting current in the light-receiving portion. This is undesirable.

That is, although it is preferred that the charge-detecting portion be directly used as a light-receiving portion from the standpoint of effective use of area, the wiring for contact of the source/drain region nevertheless blocks light from the light-receiving portion, leading to a low numerical aperture. In addition, when the silicide process is adopted, there are problems pertaining to dark current, damages, etc., because a contact is present in the light-receiving portion, it is hard to adjust the doping concentration in the lower portion of the silicide, and it is difficult to ensure the characteristics of the vertical pnp transistor. This is a new problem.

On the other hand, when the light-receiving portion is arranged separately, there should be an area for the gate for transfer and for the charge-detecting portion. Consequently, the area of the light-receiving portion cannot be large, and the numerical aperture becomes smaller.

Also, each pixel should have a transistor for selecting the desired pixel. When conventional NMOS transistors are used, however, there should be an area for element separation, leading to further decrease in the numerical aperture.

As explained above, the conventional image sensors have a common disadvantage that the area of the light-receiving portion is insufficient. This indicates that there is insufficient margin for sensitivity and resolution as important characteristics of the image sensor. Although certain improvements may be realized by means of fine processing technology and OCL (on chip lens), it is impossible to adopt the fine processing technology of CMOS as is because the leakage current required in the conventional CMOS is different from that required for the image sensor. Also, when the area of the light-receiving portion is small, the sensitivity varies depending on the OCL focus position. Consequently, a special lens design should be performed for lenses with a large F-value.

A general object of this invention is to solve problems in the prior art by providing a type of solid-state image sensing device in which a structure that can realize zero kTC noise, it can suppress black smear and dark current, and it can increase the numerical aperture and eliminate the problem of insufficient area of the light-receiving portion.

SUMMARY OF THE INVENTION

This and other objects and features are provided, in accordance with one aspect of the invention by a first solid-state image sensing device in which the solid-state image sensing device is an integration of plural pixels, each of which has a light-receiving portion that receives light and generates and accumulates a signal charge, and this has the following parts: a semiconductor substrate of the first electroconductive type; a semiconductor layer of the second electroconductive type that is formed on the principal surface of said semiconductor substrate; a gate electrode for pixel selection formed via a gate insulating film on said semiconductor layer; a first semiconductor region of the first electroconductive type that is formed in the outer layer of said semiconductor layer in the light-receiving portion positioned on one side of a gate electrode for pixel selection; a second semiconductor region of the first electroconductive type formed deeper than said first semiconductor region in the outer layer of said semiconductor layer in said light-receiving portion; and a third semiconductor region of the first electroconductive type formed in the outer layer of said semiconductor layer on the other side of the gate electrode for pixel selection, and containing an impurity of the first electroconductive type and having an impurity concentration higher than that of said first semiconductor region.

Another aspect of the invention includes a semiconductor layer of said light-receiving portion, in which light is received and the generated signal charge is accumulated, and in said light-receiving portion, modulation of the threshold of the junction transistor containing said semiconductor substrate, said semiconductor layer, and said second semiconductor region is performed by means of the signal charge accumulated in said semiconductor layer.

A further aspect of the invention comprises a gate electrode for reset that is formed via a gate insulating film on said semiconductor layer, and a fourth semiconductor region of the second electroconductive type that is formed in the outer layer of said semiconductor layer on one side of said gate electrode for reset; said first semiconductor region is formed in the outer layer of said semiconductor layer on the other side of said gate electrode for reset; said semiconductor layer, said gate electrode for reset, and said fourth semiconductor region form a buried-channel type of transistor for reset, and said signal charge accumulated in said light-receiving portion is evacuated from said light-receiving portion when said transistor for reset operates.

Yet another aspect of the invention is provided by having said gate electrode for pixel selection in one pixel be connected to said gate electrode for reset in the pixel adjacent to said one pixel.

A still further aspect of the invention includes a fifth semiconductor region of the first electroconductive type, having an impurity of the first electroconductive type and having an impurity concentration higher than that of said first semiconductor region, is formed in the outer layer of said semiconductor layer on the periphery of said first semiconductor region and in the portion other than the portion where said gate electrode for pixel selection and said gate electrode for reset are located.

Another aspect of the invention comprises a field plate formed, as the gate electrode of a transistor for element separation, via a gate insulating film in the upper layer of the semiconductor layer between adjacent pixels on the outer periphery of said fifth semiconductor region.

Yet another aspect of the invention includes, in the region where the first semiconductor region is formed, a photodiode is formed as the light-receiving portion, and light is received and the generated signal charge is accumulated in the semiconductor layer of this region.

A still further aspect of the invention is provided by the semiconductor layer, the gate electrode for pixel selection, first semiconductor region, second semiconductor region, and third semiconductor region forming a transistor for pixel selection.

Another aspect of the invention includes the threshold of the junction transistor, comprising the semiconductor substrate, semiconductor layer and second semiconductor region, being modulated by means of the signal charge accumulated in the semiconductor layer in the light-receiving portion. When the transistor for pixel selection is ON, a charge detection current flows that is modulated according to the signal charge.

Yet another aspect of the invention comprises a second solid-state image sensing device includes the solid-state image sensing device having plural pixel rows formed from plural light-receiving elements arranged in a linear configuration, with light-receiving elements in each pixel row arranged offset by about ½ pitch from those in the adjacent rows; each said light-receiving element has the following parts: a semiconductor layer of a first electroconductive type formed on the principal surface of a semiconductor substrate; a gate electrode for read formed via an insulating film on said semiconductor layer on one side of the pixel row; a gate electrode for reset formed via an insulating film on said semiconductor layer on the other side of the pixel row; a first semiconductor region of the second electroconductive type formed in the region between said gate electrode for read and said gate electrode for reset; a second semiconductor region of the second electroconductive type, having an impurity concentration higher than that of said first semiconductor region and formed on said semiconductor layer in a region nearer said gate electrode for read than said gate electrode for reset in said first semiconductor region; a third semiconductor region of the second electroconductive type, having an impurity concentration higher than that of said first semiconductor region and formed on said semiconductor layer in the region facing said first semiconductor region with said gate electrode for read sandwiched between them; and a fourth semiconductor region of the first electroconductive type, having an impurity concentration higher than that of said semiconductor layer and formed on said semiconductor layer in the region facing said first semiconductor region with said gate electrode for reset sandwiched between them; said gate electrodes for read and gate electrodes for reset of the facing light-receiving elements in adjacent pixel rows are electrically connected to each other.

REFERENCE NUMERALS AND SYMBOLS AS SHOWN IN THE DRAWINGS

In the figures, 10 represents a p-type semiconductor substrate, 11 a gate insulating film, 12 an n-type semiconductor layer, 13$a$ a gate electrode of transistor for pixel selection, 13$b$ a gate electrode of transistor for reset, 14 an n-type semiconductor layer, 15 a p-type semiconductor region (first semiconductor region), 16 a $p^+$-type semiconductor region (second semiconductor region), 17$a$ $p^{++}$-type semiconductor region (third semiconductor region), 18 an $n^+$-type semiconductor region (fourth semiconductor region), 19 an interlayer insulating film, 20, 21 contact plugs, 22, 23 upper layer wirings, N an n-type semiconductor layer, P a p-type semiconductor region, $P^+$ a $p^+$-type semiconductor region, $P^{++}$ a $p^{++}$-type semiconductor region, $N^+$ an $n^+$-type semiconductor region, SG a gate electrode of transistor for pixel selection, RG a gate electrode of transistor for reset, $G_n$, $G_{n+1}$, $G_{n+2}$ gate electrodes, FP a field plate, E, $E_1$, $E_2$ pixels, R a light-receiving portion, $Tr_1$, $Tr_3$ transistors for pixel selection, $Tr_2$, $Tr_4$ transistors for reset, $JT_1$, $JT_2$, $JT_a$, $JT_b$, $JT_c$ vertical pnp transistors (junction transistor), $CT_1$, $CT_2$ contacts, PD, $PD_1$, $PD_2$ photodiodes, $CH_1$, $CH_2$ channel-forming regions, L a low voltage, M a middle voltage, H a high voltage, I a charge-detecting current, DP1, DP2, DP6 n-type electroconductive impurity, DP3-DP5 p-type electroconductive impurity, and PR1-PR4 resist film.

DESCRIPTION OF THE EMBODIMENTS

Embodiments of this invention will be explained in the following, with reference to figures.

First Embodiment

Figure 1:
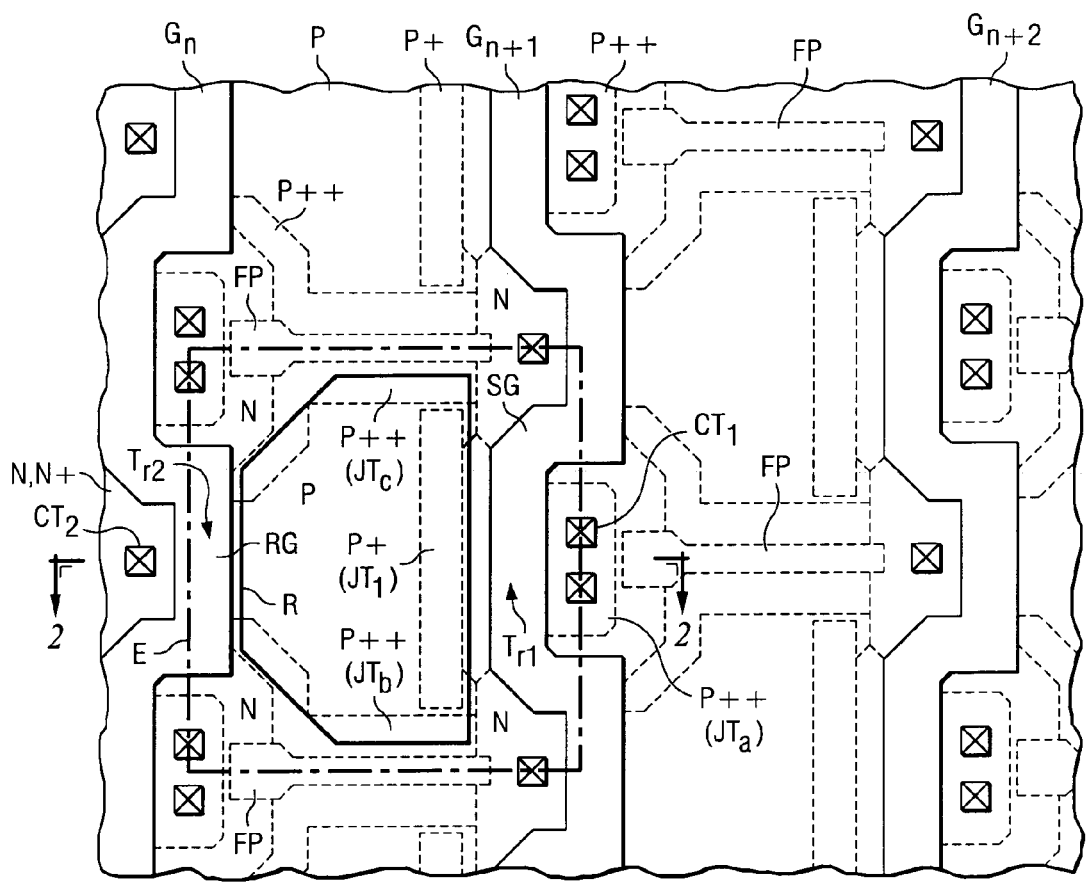
FIG. 1 is a plan view of the CMOS sensor in the first embodiment of this invention.

The solid-state image sensing device of this embodiment is a CMOS image sensor. FIG. 1 is its plan view.

Light-receiving portion R that receives light and generates and accumulates signal charge is provided in each pixel E. More specifically, a p-type semiconductor region (first semiconductor region) is formed in the outer layer portion of an n-type semiconductor layer (not shown in the figure) formed on the principal surface of a p-type silicon semiconductor substrate (not shown in the figure), and this region forms a photodiode as light-receiving portion R.

In the p-type semiconductor region as said photodiode, a $p^+$-type semiconductor region (second semiconductor region) is formed, in a slender slit-like shape, that is deeper than the p-type semiconductor region, and a vertical pnp transistor (junction transistor $JT_1$) is formed between the $p^+$-type semiconductor region and the p-type semiconductor substrate.

Also, adjacent to the p-type semiconductor region as photodiode, gate electrode for pixel selection SG is formed via a gate insulating film on the upper layer of the n-type semiconductor layer. Beside it, a $p^{++}$-type semiconductor region (third semiconductor region) containing a p-type impurity with a concentration higher than that in the p-type semiconductor region and $p^+$-type semiconductor region is formed in the outer layer portion of the n-type semiconductor layer. Said p-type semiconductor region and $p^+$-type semiconductor region as well as $p^{++}$-type semiconductor region form the source/drain regions of transistor for pixel selection $Tr_1$. Contact $CT_1$ is connected to the $p^{++}$-type semiconductor region.

Also, vertical pnp transistor (unction transistor $JT_a$) is formed between the $p^{++}$-type semiconductor region (third semiconductor region) and the p-type semiconductor substrate.

Also, adjacent to the p-type semiconductor region as photodiode, gate electrode for reset RG is formed via a gate insulating film on the upper layer of the n-type semiconductor layer. Beside it, an $n^+$-type semiconductor region (fourth semiconductor region) is formed in the outer layer portion of the n-type semiconductor layer, forming a buried channel type evacuation transistor $Tr_2$ for reset, with said channel formed inside the n-type semiconductor layer. Contact $CT_2$ is connected to the $n^+$-type semiconductor region.

On the outer periphery of the p-type semiconductor region (first semiconductor region), for the portion except portion where gate electrode for pixel selection SG and gate electrode for reset RG are formed, a $p^{++}$-type semiconductor region (fifth semiconductor region) is formed that contains a p-type impurity with a concentration higher than that of the p-type semiconductor region, and that serves as a potential barrier for element separation. As a result, vertical pnp transistors (junction transistors $JT_b$, $JT^c$) are formed between the $p^{++}$-type semiconductor region (fifth semiconductor region) and the p-type semiconductor substrate.

In addition, on the outer periphery of the $p^{++}$-type semiconductor region (fifth semiconductor region), and on the upper layer of the semiconductor layer between adjacent pixels, field plate FP serving as a gate electrode of the transistor for element separation is formed via a gate insulating film.

The transistor with field plate FP as its gate electrode, and the $p^{++}$-type semiconductor regions (fifth semiconductor regions) of the two adjacent pixels as its source/drain region, is set at a threshold that is not ON under the floating potential state of field plate FP.

In order to avoid multi-layer structures for the gate material, the structure has field plate FP and the various gate electrodes (SG, RG) for pixel selection and for reset separated from each other by an n-type semiconductor region.

Pixels E, each with the structure, are arranged as a matrix to form a CMOS image sensor.

Said gate electrode for pixel selection SG is connected to the pixel arranged on the same row, and it is also connected to gate electrode for reset RG of the pixel arranged on the adjacent row.

That is, in pixel RG [sic; P] that takes the nth gate electrode $G_n$ as a gate electrode for reset, the adjacent (n+1)th gate electrode $G_{n+1}$ becomes gate electrode for pixel selection SG, and, in pixel RG that takes the (n+1)th gate electrode $G_{n+1}$ as a gate electrode for reset, the adjacent (n+2)th gate electrode $G_{n+2}$ becomes gate electrode for pixel selection SG. As shown in FIG. 1, the pixels arranged in adjacent rows are shifted from each other by about ½ pitch.

Figure 2A:
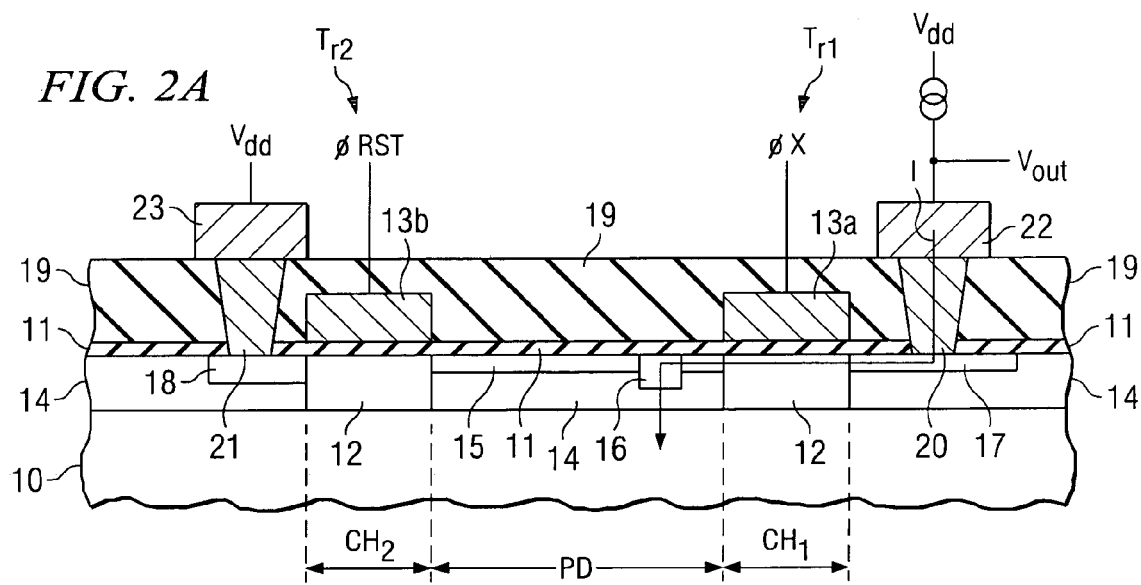
FIG. 2(A) is a cross section taken across A-A' in FIG. 1.

FIG. 2(A) is a cross section taken across A-A' in FIG. 1.

On the principal surface of p-type silicon semiconductor substrate 10, n-type semiconductor layer 12, 14 is formed, and p-type semiconductor region (first semiconductor region) 15 is formed in its outer layer portion. This region becomes photodiode PD, and forms a light-receiving portion.

In p-type semiconductor region 15 as photodiode, p$^+$-type semiconductor region (second semiconductor region) 16 is formed, and vertical pnp transistor (junction transistor JT$_1$) is formed between p$^+$-type semiconductor region 16 and p-type semiconductor substrate 10.

Also, adjacent to p-type semiconductor region 15, gate electrode for pixel selection 13a (SG) is formed, via gate insulating film 11, on the upper layer of n-type semiconductor layer 12, 14. Beside it, p$^{++}$-type semiconductor region (third semiconductor region) 17 is formed on the outer layer portion of n-type semiconductor layer 12, 14. In this way, a PMOS transistor is formed serving as transistor Tr$_1$ for pixel selection.

A vertical pnp transistor (junction transistor) is formed between said p$^{++}$-type semiconductor region 17 and p-type semiconductor substrate 10.

Also, adjacent to p-type semiconductor region 15, gate electrode for reset 13b (RG) is formed, via gate insulating film 11, on the upper layer of n-type semiconductor layer 12, 14. Beside it, n$^+$-type semiconductor region (fourth semiconductor region) 18 is formed on the outer layer portion of n-type semiconductor layer 12, 14. In this way, an NMOS transistor having a buried channel is formed that serves as transistor Tr$_2$ for reset.

For said n-type semiconductor layer 12, 14, the concentrations of the n-type impurity in n-type semiconductor layer 12 below gate electrode for pixel selection 13a (SG) and gate electrode for reset 13b (RG) are different from that in n-type semiconductor layer 14 which is outside these portions. Their concentrations are adjusted to optimize the transistor threshold and the photodiode characteristics, respectively.

Interlayer insulating film 19 of silicon oxide is formed on the entire surface of said gate electrodes 13a, 13b and on the upper layer of gate insulating film 11.

Contact opening CT$_1$ that reaches p$^{++}$-type semiconductor region 17 is formed in interlayer insulating film 19, contact plug 20 is buried there and this is connected to upper layer wiring 22.

On the other hand, constant opening CT$_2$ that reaches n$^+$-type semiconductor region 18 is formed in interlayer insulating film 19, where contact plug 21 is buried, and this is connected to upper layer wiring 23.

Figure 2B:
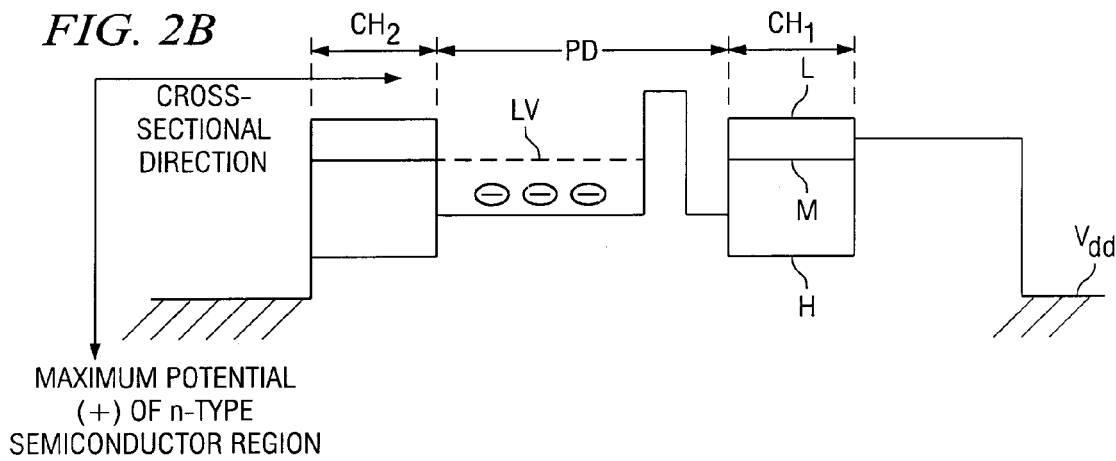
FIG. 2(B) is a potential diagram corresponding to the cross section of FIG. 2(A).

FIG. 2(B) is a potential diagram corresponding to the cross section of FIG. 2(A). In this figure, the abscissa represents the cross-sectional direction, and the ordinate represents the maximum potential (+direction is down) of the n-type semiconductor region. The operation of the CMOS sensor with the constitution will be explained in the following, with reference to FIG. 2(A).

Transistor for pixel selection Tr$_1$ and transistor Tr$_2$ for reset are each driven with three voltage values. That is, one of the three values of high voltage H, middle voltage M, and low voltage L is adopted as voltage φX applied to gate electrode SG of transistor Tr$_1$ for pixel selection and as voltage φRST applied to gate electrode RG of transistor Tr$_2$ for reset, and a potential of H, M or L is generated in the channel-forming regions CH$_1$, CH$_2$ of the transistors.

Also, a constant-current source, which is connected to V$_{dd}$, and V$_{dd}$, is applied to upper layer wiring 22 connected to p$^{++}$-type semiconductor region 17 and to upper layer wiring 23 connected to n$^+$-type semiconductor region 18, respectively.

When voltage φX and voltage φRST are middle voltage M, the potential of photodiode region PD becomes the trough portion, and the signal charge generated by light reception accumulates.

Level LV when the maximum signal charge has accumulated corresponds to the potential when voltage φRST is middle voltage M. The signal charge generated over this level passes over the potential barrier of transistor Tr$_2$ for reset and is evacuated.

p$^+$-type semiconductor region 16 in the photodiode region becomes a potential barrier, and, because the gate voltage of transistor Tr$_1$ for pixel selection is at low voltage L, as shown in FIG. 2(A), charge-detecting current I, a hole current, flows from upper layer wiring 22 to p-type semiconductor substrate 10 through junction transistor JT$_1$ corresponding to the p$^+$-type semiconductor region 16.

In this case, the threshold of junction transistor JT$_1$ is modulated by means of the signal charge accumulated in photodiode region PD. Because the gate voltage of transistor Tr$_1$ for pixel selection is at low voltage L and the transistor is ON, the voltage modulated according to the signal charge appears at the V$_{out}$ terminal.

Also, because the gate voltage of transistor Tr$_2$ for reset is at high voltage H, all of the signal charge accumulated in photodiode region PD is evacuated, and the reset operation is performed.

The signal charge is read from the difference between the output voltage when the signal charge is accumulated in said photodiode region PD and the output voltage after the reset operation.

In this way, all of the transistors are OFF when at the middle value, and, assuming a PMOS transistor is used as the transistor for pixel selection and an NMOS transistor is used as the transistor for reset, the transistor for reset becomes ON when a high voltage is applied and the transistor for pixel selection becomes ON when a low voltage is applied. Pixel read and reset are performed by means of these combinations.

Figure 3:
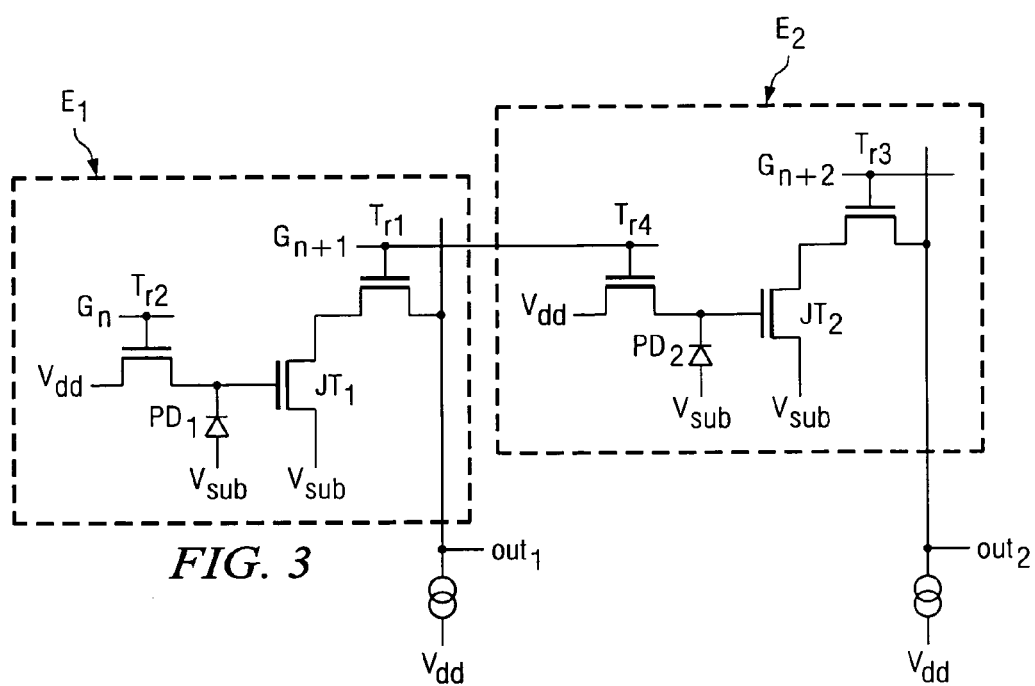
FIG. 3 is an equivalent circuit diagram illustrating a two-pixel section of the CMOS in the first embodiment.

FIG. 3 is an equivalent circuit diagram illustrating a two-pixel portion of the CMOS sensor in this embodiment.

One pixel E$_1$ is composed of photodiode PD$_1$, transistor Tr$_1$ for pixel selection, transistor Tr$_2$ for reset, and junction transistor JT$_1$. The nth gate electrode G$_n$ is a gate electrode for reset. On the other hand, the (n+1)th gate electrode G$_{n+1}$ is the gate electrode SG for pixel selection.

Adjacent pixel E$_2$ has the same constitution, and it is composed of photodiode PD$_2$, transistor Tr$_3$ for pixel selection, transistor Tr$_4$ for reset, and junction transistor JT$_2$. The (n+1)th gate electrode G$_{n+1}$ is the gate electrode RG of transistor Tr$_4$ for reset.

Figure 4:
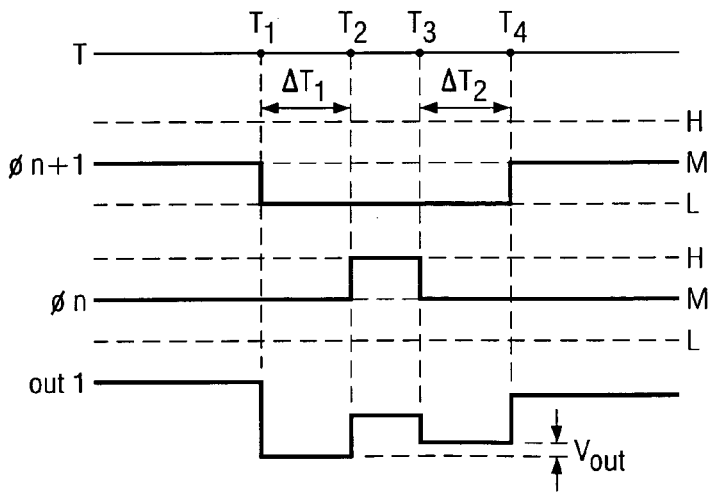
FIG. 4 is a timing chart illustrating the read and reset operation of the signal charge of the CMOS sensor in the first embodiment.

FIG. 4 is a timing chart illustrating the signal charge read and reset operations in the CMOS sensor of this embodiment.

In FIG. 3, application voltage φn of the nth gate electrode G$_n$, application voltage φn+1 of the (n+1)th gate electrode G$_{n+1}$, and output voltage out1 of pixel E$_1$ are shown at time T.

First of all, middle voltage M is taken as the initial value for φn and φn+1. In this case, light is received in the photodiode of the light-receiving portion, and a signal charge is generated.

At time T$_1$, φn+1 is at low voltage L, and the transistor for pixel selection is ON. As a result, output voltage out1 modulated by the accumulated signal charge is obtained.

Then, at time $T_2$, ϕn is at high voltage H, and the transistor for reset is ON. In this case, all of the accumulated signal charge is evacuated.

Output voltage out1 modulated by the accumulated signal charge is obtained only during the period $\Delta T_1$ between time $T_1$ and time $T_2$.

Then, at time $T_3$, ϕn is at middle voltage M, and the transistor for reset is OFF. In this case, output voltage out1 is obtained in the state in which all of the signal charge is evacuated.

At time $T_4$, ϕn+1 is at middle voltage M, and the transistor for pixel selection is OFF.

Output voltage out1 in the state in which all of the signal charge is evacuated is obtained only during the period of $\Delta T_2$ from time $T_3$ to time $T_4$.

From output voltage out1 obtained as explained above current, a voltage that is modulated according to the signal charge can be obtained by taking difference $\Delta V_{out}$ between the output in period $\Delta T_1$ and the output in period $\Delta T_2$.

In the CMOS sensor of the embodiment, a signal is output from the contact of the source/drain region of the transistor for pixel selection when the transistor for pixel selection is ON.

The signal charge accumulated in the n-type semiconductor region in a floating potential state and sandwiched between the p-type substrate and the p-type surface neutral region modulates the threshold of the vertical pnp transistor (junction transistor $JT_1$) shown in FIG. 2(A), so that transistor $Tr_1$ for pixel selection becomes ON, a current flows, and a voltage is output corresponding to the signal charge amount accumulated in the n-type semiconductor region that forms the photodiode of the light-receiving portion.

In this case, because the source/drain region of the transistor for pixel selection is p-type, it is possible to read the potential of the surface neutral region without using metal wiring in the light-receiving portion. This structure eliminates the need to have a contact in the light-receiving portion, and it is also possible to reduce the contact that becomes a series resistance when a current flows.

Also, because the semiconductor region for potential output is p-type, the n-type semiconductor region that supplies $V_{dd}$ is separated by a evacuation layer, and there is no need to separate the elements by means of a LOCOS element-separating insulating film. This is also an advantage.

For said CMOS sensor, it is necessary to have a potential barrier to hold the signal charge accumulated in the n-type semiconductor region in the floating potential state inside the light-receiving portion, and an independently variable potential barrier for performing the reset operation to evacuate the signal charge to the outside. In order to realize this, two types of vertical pnp transistor (junction transistor $JT_1$) and vertical pnp transistors (junction transistors $JT_b$, $JT_c$) are used as fixed potential barriers, and transistor $Tr_2$ for reset, made of an n-channel MOS transistor having a buried channel, is used as the independently variable potential barrier.

Among these, the vertical pnp transistor Function transistor $JT_1$) plays two roles, that is, for charge detection and as potential barrier for the accumulated charge. This structure has a p-type floating neutral region formed in the upper layer of the n-type semiconductor region, and it is possible to have the same source potential output as that of the vertical pnp structure of the prior art.

By means of a combination of the potential barriers, it is possible to make use of single gate electrode for both the gate electrode of the transistor for reset and the gate electrode of the transistor for pixel selection of different pixels. That is, the gate electrode of transistor $Tr_1$ for pixel selection is connected to the gate electrode of the transistor for reset of the pixel positioned on the right side the figure, and, when reset is performed for the pixel on the right side, the vertical pnp transistor (junction transistor $JT_1$) becomes a potential pnp transistor (junction transistor $JT_1$) becomes a potential barrier, and it is possible to prevent reset at the same time.

In addition, by means of a design that ensures that the potential barrier becomes the lowest among the three types of potential barriers when no reset pulse is applied to the voltage applied to the gate electrode of the transistor for reset, the barrier also functions to suppress blooming.

With said CMOS sensor, except for the portion of the transistor for pixel selection and the portion of the transistor for reset, a potential barrier is formed by means of a vertical pnp transistor (junction transistor), and, if the p-type surface neutral region is not electrically isolated using a certain method, different source potentials are applied to pixels, and it is impossible to perform pixel selection.

In this case, by adopting field plate FP using a MOS structure between the upper and lower pixels, it is possible to reduce the area needed for pixel separation in this structure.

Also, in order to avoid a multi-layer structure for the gate material, the structure separates field plate FP and the various gate electrodes from each other an n-type neutral region.

In this case, in the pn junction portion, the evacuation layer reaches the silicon surface. However, for the signal charge generated at the interface level, because there is a potential barrier due to the vertical pnp transistors (junction transistors $JT_1$, $JT_b$, $JT_c$), the change does not flow into the light-receiving portion, and it is evacuated in the n-type neutral region. Moreover, the signal charge generated at the interface below field plate FP also does not flow into the light-receiving portion because there is a potential barrier due to vertical pnp transistors (junction transistors $JT_b$, $JT_c$), and it is not observed as a dark current.

Also, in the CMOS sensor, the gate electrode of transistor $Tr_1$ for pixel selection shown in FIG. 1 is connected to the gate electrode of the transistor for reset of the pixel on the right side in the figure. If the pixel on the adjacent right side is reset, the vertical pnp transistor (junction transistor $JT_1$) becomes a potential barrier, and this structure can prevent reset at the same time. It is possible for adjacent pixels to share the gate electrode of transistor $Tr_1$ for pixel selection and the gate electrode of the transistor for reset.

The method for manufacturing CMOS sensor in this embodiment will be explained in the following.

Figure 5A:
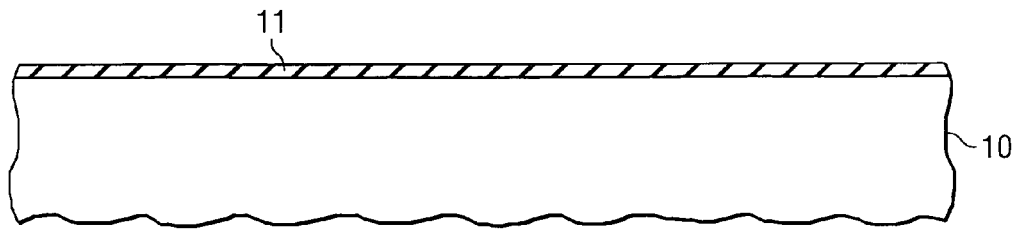
FIGS. 5(A)-(C) are cross sections illustrating the manufacturing steps in the manufacturing method of the CMOS sensor in the first embodiment.

First of all, as shown in FIG. 5(A), gate oxide film 11 is formed on the principal surface of p-type silicon semiconductor substrate 10, using, for example, a thermal oxidation method.

Figure 5B:
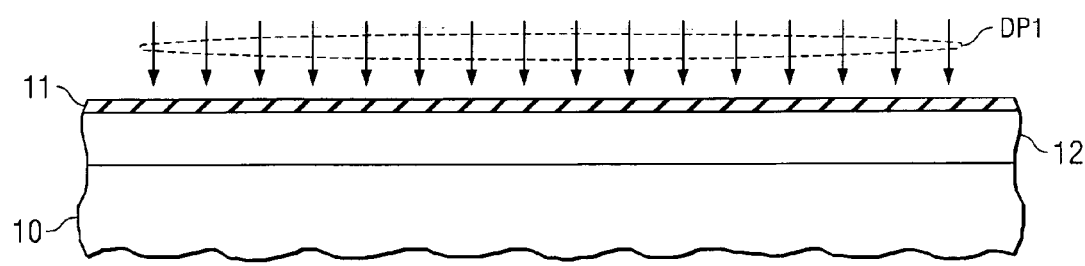

Then, after formation of a protective film (not shown in the figure) that is open in the sensor region, phosphorus ions are implanted to serve as n-type electroconductive impurity DP1, as shown in FIG. 5(B). The injection energy is 150 keV and the dose is $8 \times 10^{11}/cm^2$, thereby adjusting the threshold of the transistor and forming n-type semiconductor layer 12 on the principal surface of p-type silicon semiconductor substrate 10.

Figure 5C:
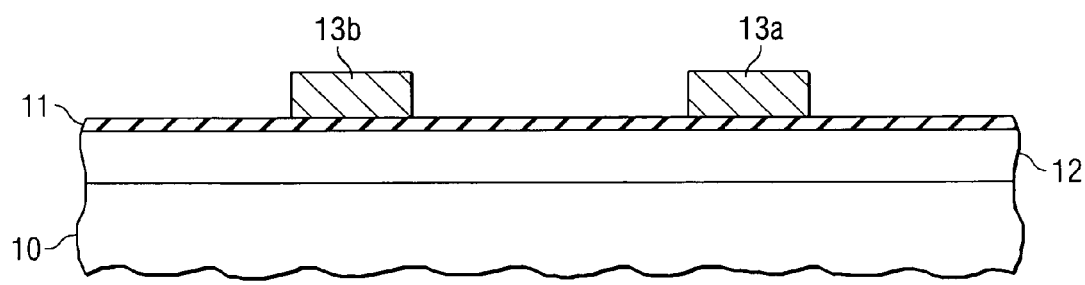

Then, as shown in FIG. 5(C), a CVD (chemical vapor deposition) method, for example, is adopted to deposit polysilicon, and a resist film (not shown in the figure) of the gate electrode pattern is formed by means of photolithography. With this being used as a mask, the polysilicon is subjected to patterning processing by means of reactive ion etching or another etching process, forming gate electrode 13a of the transistor for pixel selection, and gate electrode 13b for the transistor for reset.

Figure 6A:
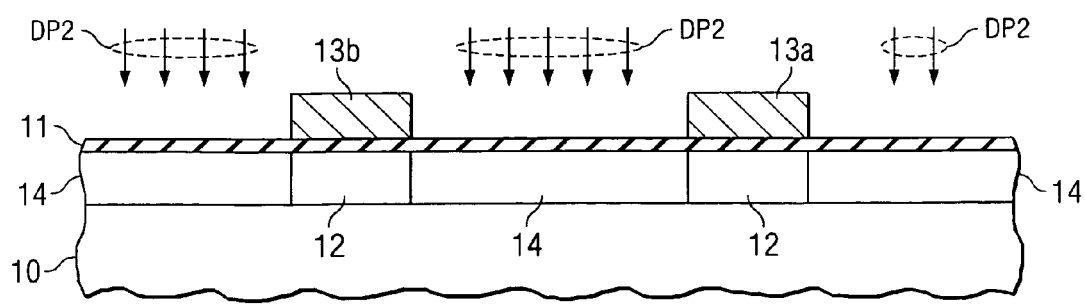
FIGS. 6(A)-(C) are cross sections illustrating the process steps after those shown in FIG. 5.

Then, after formation of a protective film (not shown in the figure) open in the sensor region, phosphorus ions, for example, are implanted as n-type electroconductive impurity DP2, as shown in FIG. 6(A). The injection energy is 220 keV and the dose is $2.5 \times 10^{12}/cm^2$, and n-type semiconductor layer 14 with an adjusted concentration of the n-type impurity for a photodiode is thereby formed in n-type semiconductor layer 12, except for in the portion below gate electrodes 13a, 13b.

Figure 6B:
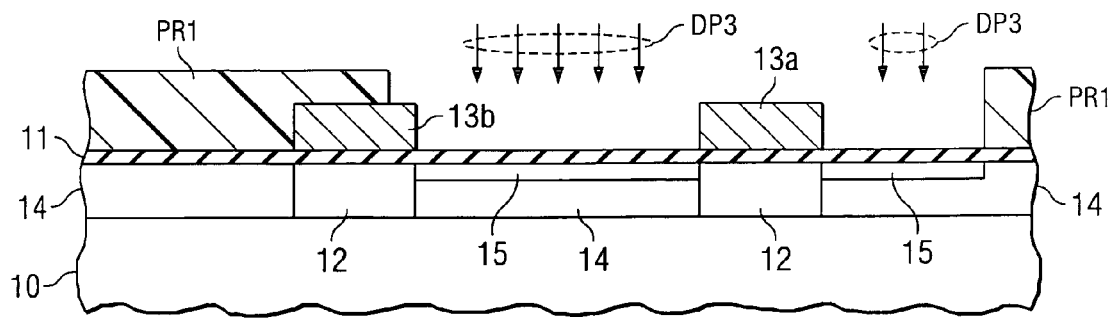

Then, as shown in FIG. 6(B), resist film PR1 that is open in the photodiode region and in the region of the transistor for pixel selection is formed by means of photolithography. For example, phosphorus ions are implanted, as p-type electroconductive impurity DP3, at an injection energy of 20 keV and a dose of $6.5 \times 10^{12}/cm^2$, thereby forming p-type semiconductor region (first semiconductor region) 15 in the outer layer portion of n-type semiconductor layer 14.

Figure 6C:
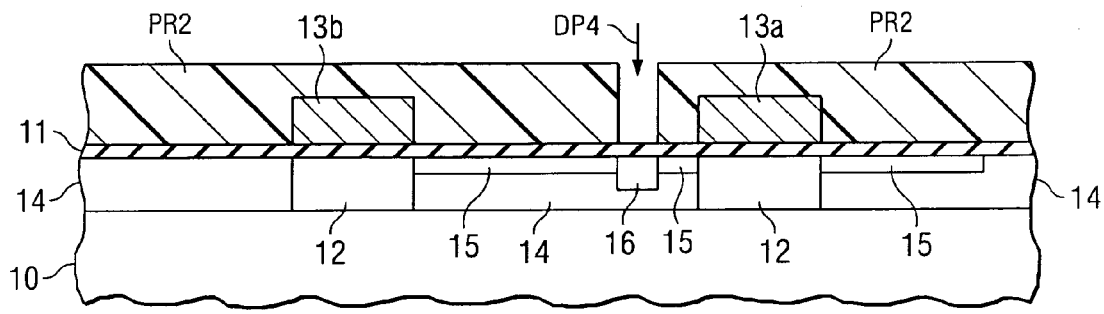

Then, as shown in FIG. 6(C), resist film PR2 that has a slit-shaped opening in a portion of the photodiode region is formed by means of photolithography. Then, phosphorus ions, for example, are implanted as p-type electroconductive impurity DP4, at the injection energy is 140 keV and the dose is $1.8 \times 10^{12}/cm^2$, thereby forming $p^+$-type semiconductor region (second semiconductor region) 16 in the outer layer portion of n-type semiconductor layer 14 within p-type semiconductor region 15 which becomes a photodiode.

As a result, a vertical pnp transistor (junction transistor $JT_1$) is formed between $p^+$-type semiconductor region 16 and p-type semiconductor substrate 10.

Figure 7A:
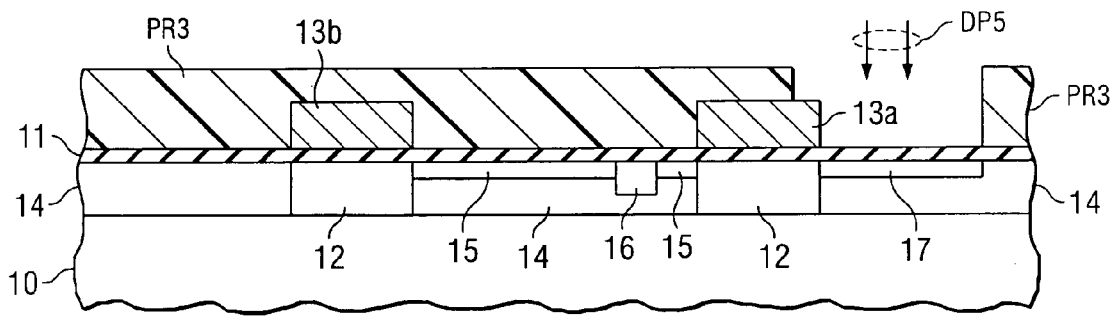
FIGS. 7(A)-(C) are cross sections illustrating the process steps after those shown in FIG. 6.

Then, as shown in FIG. 7(A), resist film PR3 that is open in the source/drain region of the transistor for pixel selection is formed by means of photolithography. Then phosphorus ions, for example, are implanted as p-type electroconductive impurity DP5. The injection energy is 30 keV and the dose is $1.2 \times 10^{13}/cm^2$, thereby forming $p^{++}$-type semiconductor region (third semiconductor region) 17 as the source/drain region of the transistor for pixel selection in the outer layer portion of n-type semiconductor layer 14.

In this way, PMOS transistor $Tr_1$ for pixel selection is formed, with its source/drain region consisting of $p^{++}$-type semiconductor region 17 and p-type semiconductor region 15 as well as $p^+$-type semiconductor region 16. In addition, vertical pnp transistor (unction transistor $JT_a$) is formed between $p^{++}$-type semiconductor region 17 and p-type semiconductor substrate 10.

Figure 7B:
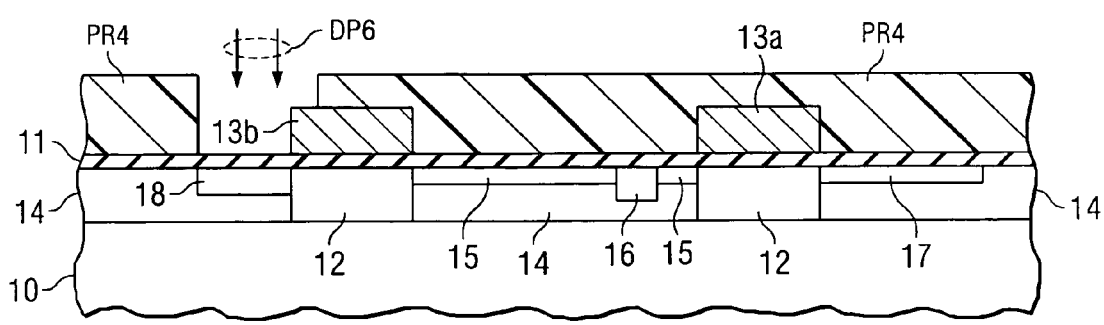

Then, as shown in FIG. 7(B), resist film PR4 that is open in the source/drain region of the transistor for reset is formed by means of photolithography. Then, for example, n-type electroconductive impurity DP6 is ion implanted, forming $n^+$-type semiconductor region (fourth semiconductor region) 18 in the outer layer portion of n-type semiconductor layer 14.

In this way, buried channel type NMOS transistor $Tr_2$ for reset is formed, with its source/drain region consisting of $n^+$-type semiconductor region 18 and n-type semiconductor layer 14.

Figure 7C:
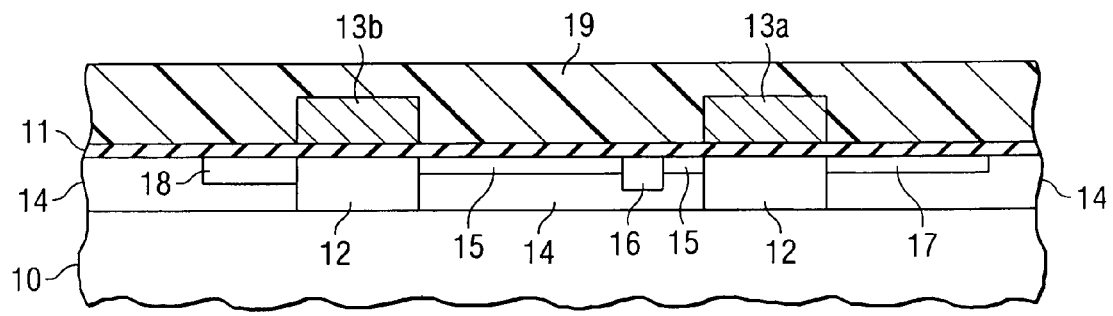

Then, as shown in FIG. 7(C), silicon oxide is deposited on the entire surface by means of, for example, a CVD method, to form interlayer insulating film 19.

Figure 8A:
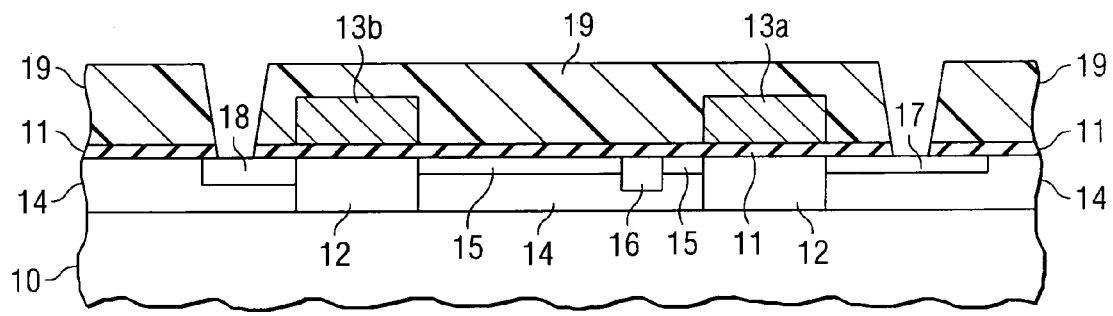
FIGS. 8(A)-(C) are cross sections illustrating the process steps after those shown in FIG. 7.
Figure 8B:
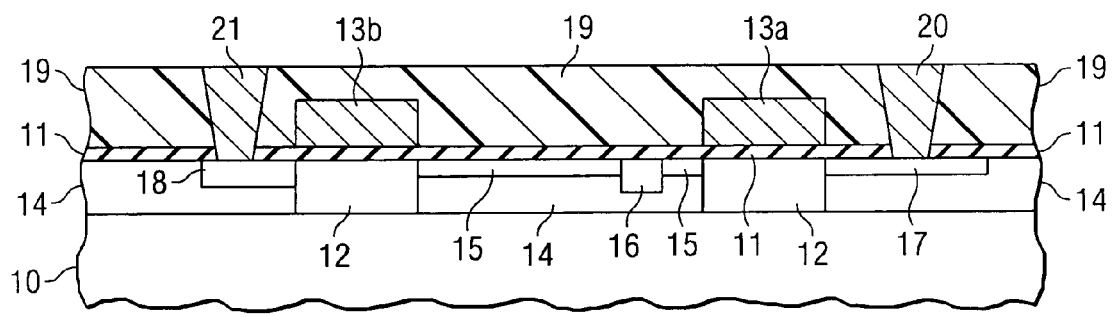

Then, as shown in FIG. 8(A), contact holes CT1, CT2 that reach $p^{++}$-type semiconductor region 17 and $n^+$-type semiconductor region 18 are opened, and, as shown in FIG. 8(B), an electroconductive material is buried to form contact flag 20 connected to $p^{++}$-type semiconductor region 17, and to form contact flag 21 connected to $n^+$-type semiconductor region 18.

Figure 8C:
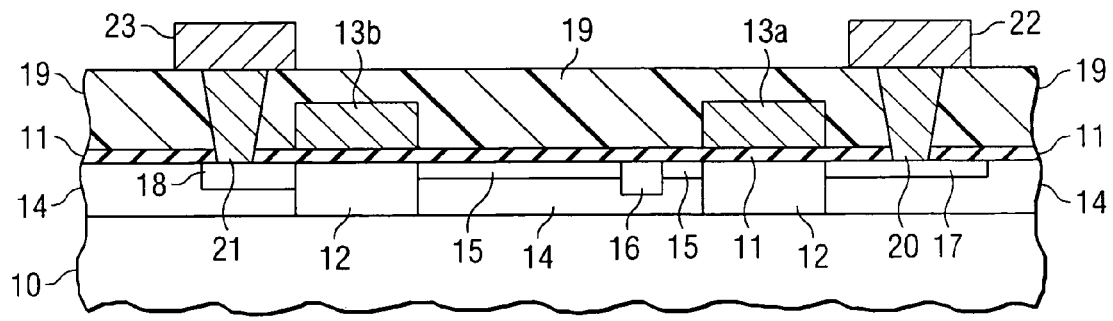

Then, as shown in FIG. 8(C), upper layer wiring 22 connected to contact flag 20, and upper layer wiring 23 connected to contact flag 21, are respectively formed, completing the CMOS sensor with the constitution shown in FIG. 2(A).

As explained above, in the method for manufacturing a CMOS sensor of this embodiment, one can adopt a CMOS process in the step for formation of $n^+$-type semiconductor region (fourth semiconductor region) 18 shown in FIG. 7(B) and thereafter.

That is, by adding five masks in the conventional analog CMOS process, it is possible to form a preferred semiconductor region (diffusion layer) in the CMOS sensor of this embodiment. As can be seen from the number of the added process steps, all of the transistors for the pixels are dedicated transistors designed with emphasis placed on image quality, instead of the conventional analog CMOS.

With the novel charge-detecting method wherein the current for detecting the charge flows in the depth direction in the CMOS sensor of the embodiment, no kTC noise is generated accompanying the reset operation, and there is no black smear problem. Also, because the charge-detecting current is high, the Johnson noise level can be reduced.

By adopting PMOS transistors in said novel charge-detecting portion, it is possible to solve the problems of the prior art, such as the difficulty in increasing the numerical aperture due to the presence of a contact in the light-receiving portion, the problem of dark current and damage when a silicide process is adopted, and the difficulty in adjusting the impurity concentration in the portion below the silicide. With the same design rule, this invention can realize a higher numerical aperture, and it can realize CMOS with higher sensitivity and higher resolution.

EMBODIMENT EXAMPLE 1

For the CMOS sensor manufactured using the manufacturing method, the signal charge read and reset operations are performed in this embodiment example.

The operations are performed according to the timing chart shown in FIG. 4, and are carried out in the illuminated state and dark state, respectively.

Figure 9A:
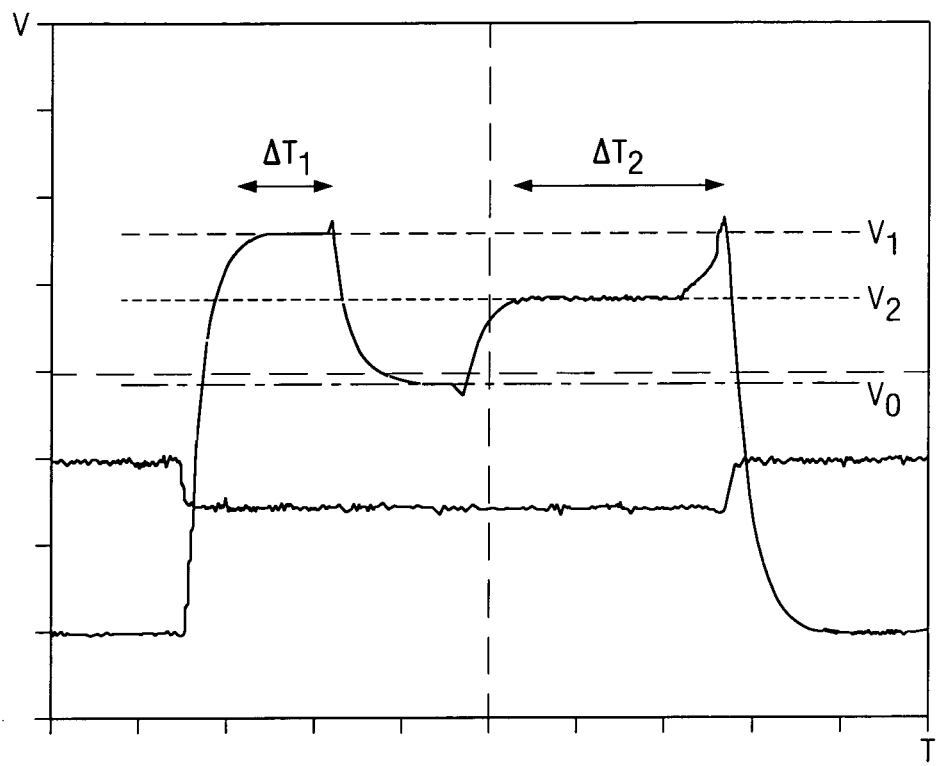
FIGS. 9(A) and (B) are plots of the output voltage (V) versus time (T) for the CMOS sensor in Embodiment Example 1, in the illuminated state and the dark state respectively.

The results are shown in FIG. 9. FIGS. 9(A) and (B) are plots illustrating output voltage V versus time T in the illuminated state and dark state, respectively.

In the illuminated state shown in FIG. 9(A), output voltage $V_1$ modulated by the accumulated signal charge is obtained during period $\Delta T_1$; output voltage $V_2$ corresponding to complete evacuation of the accumulated signal charge is obtained during period $\Delta T_2$; and output voltage $V_0$ is obtained during the process of evacuation of the signal charge due to reset. A voltage modulated according to the signal charge can be obtained from the difference of these output voltages $V_1$-$V_2$.

Figure 9B:
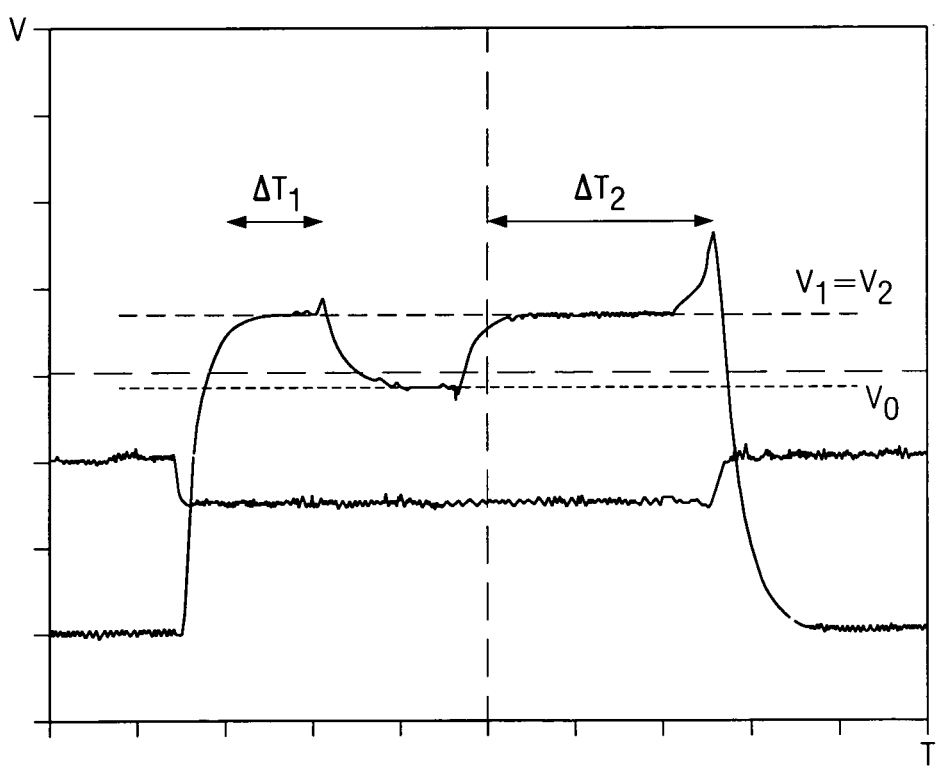

On the other hand, in the dark state shown in FIG. 9(B), output voltage $V_1$ modulated by the signal charge accumulated during period $\Delta T_1$, and the output voltage $V_2$ at the time of complete evacuation of the accumulated signal charge in period $\Delta T_2$ are equal to each other. That is, the charge accumulated in the dark state is essentially zero.

EMBODIMENT EXAMPLE 2

Two CMOS sensor samples were prepared using the manufacturing method. For each sample, relationship between the difference in output voltage before and after reset ($V_{out}=V_1-V_2$) and the illuminance was studied.

Figure 10A:
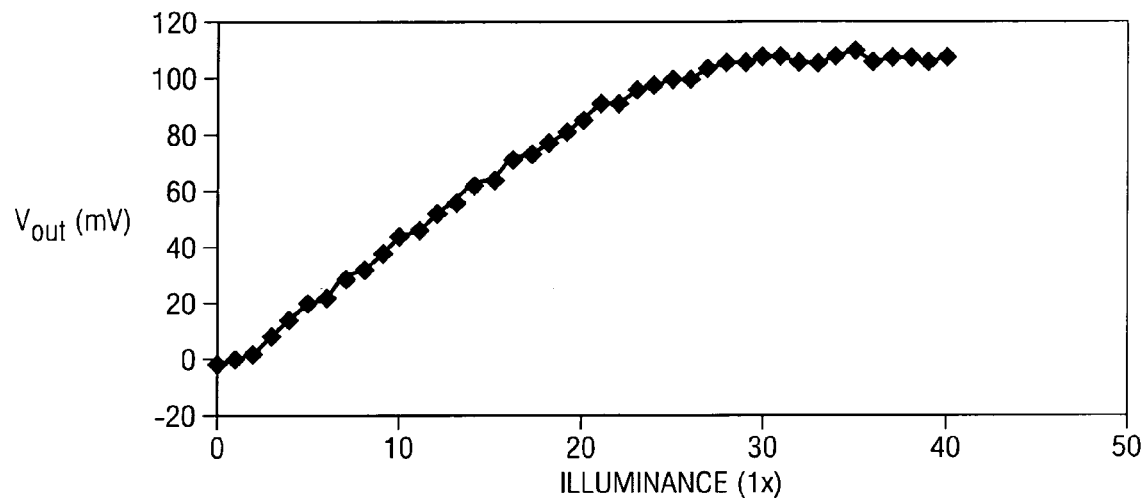
FIGS. 10(A) and (B) are diagrams illustrating the relationship between the difference in output voltage before and after reset of the CMOS sensor and the illuminance for Embodiment Example 2.
Figure 10B:
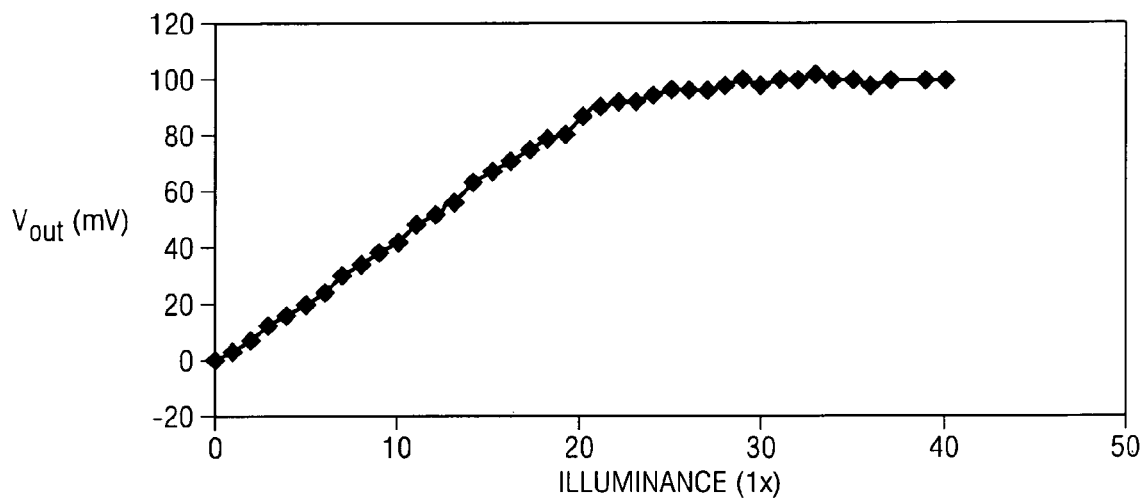

The results are shown in FIGS. 10(A) and (B). It can be seen that for both CMOS sensor samples, the relationship between the output voltage difference and the illuminance is nearly linear up to 20-30 lux. It has also been found that the reproducibility is good.

Second Embodiment

Figure 11:
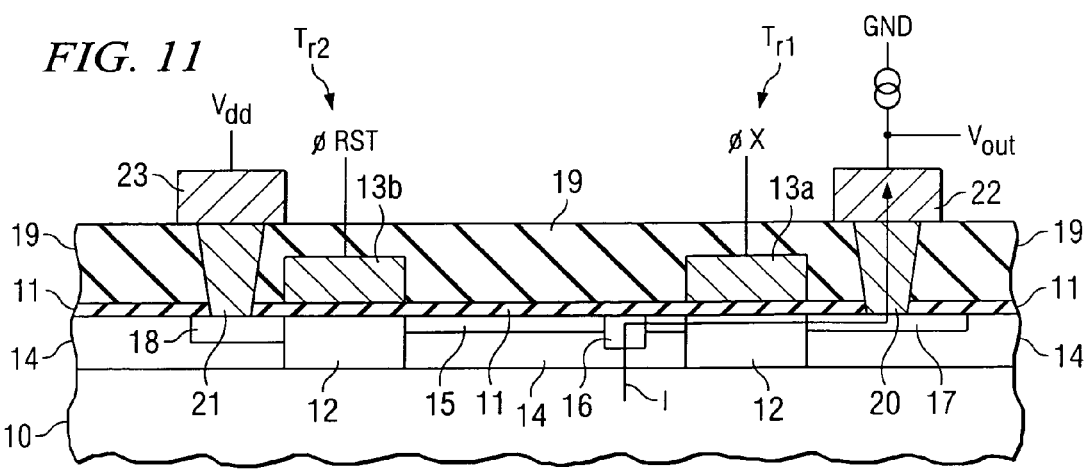
FIG. 11 is a cross section of the CMOS sensor in the second embodiment.

FIG. 11 is a cross section of the CMOS sensor in this embodiment.

The constitution is substantially the same as that of the CMOS sensor in the first embodiment. However, this embodiment differs from the first embodiment in that the contact in the source/drain region for output is connected to ground (GND) instead $V_{dd}$.

That is, in this case, because of substrate potential $V_{sub}$ needed to drive the PMOS transistor, charge-detecting current I flows in the direction opposite to that in the first embodiment, from p-type silicon semiconductor substrate 10 through vertical pnp transistor (junction transistor $JT_1$) to transistor for pixel selection (PMOS transistor) $Tr_1$.

For the CMOS sensor in this embodiment, first of all, only a voltage below substrate potential $V_{sub}$ is applied to the source/drain region of the transistor for pixel selection (PMOS transistor). Consequently, the danger of a rise in the DC level of $V_{out}$ and the flow of a forward current between $V_{out}$ and $V_{dd}$ can be entirely prevented. This is an advantage. This means that a larger current can flow in the vertical pnp transistor (junction transistor $JT_1$).

In addition, when the voltage of the read pulse of the transistor for pixel selection is raised a little over 0 V, if the current is sufficiently large, the operation is performed in the saturated region, and the short-channel effect enables the operation to be performed at a gain more than ten times higher than in the prior art. This is the most significant advantage of this embodiment.

Why the operation can be performed at a gain more than ten times higher than in the prior art will be explained in the following.

Figure 12:
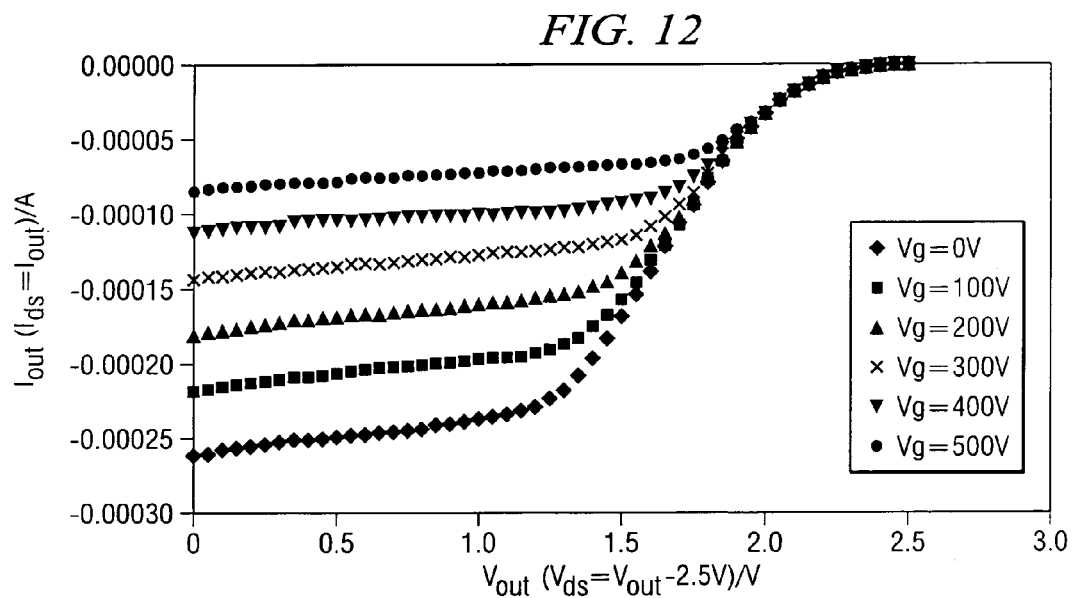
FIG. 12 is a diagram illustrating the measured I-V characteristics of the PMOS transistor used as a transistor for pixel selection in the CMOS sensor pertaining to the second embodiment.

FIG. 12 is a diagram illustrating the results of measurement of the I-V characteristics of a PMOS transistor used as the transistor for pixel selection in a CMOS sensor of the second embodiment.

The normal conditions for reading the pixel information include a PMOS gate bias of 0 V, and a DC output level near 1.5 V. Consequently, the PMOS transistor operates in a linear region. In this situation the PMOS simply works as a switch, and $dV_d/dV_s$ is nearly unity.

Now, assuming the gate bias in the read operation to be changed from 0 V to 300 mV when the output DC level is 1.5 V, the operation mode makes a transition to the saturated region. In this region, as the signal charge accumulated in the light-receiving portion decreases and the input voltage $V_s$ to PMOS transistor falls, the voltage between gate and source, $V_{gs}$, decreases. Consequently, under a constant current condition, the drain voltage $V_d$ ($V_{out}$) falls more significantly. This effect occurs when the drain side of the transistor for pixel selection is taken as the output terminal. In this embodiment, the characteristics can be realized only when charge-detecting current I flows in the direction shown in FIG. 11.

As shown in FIG. 12, even when the short-channel FET is in the saturated region, the source-drain current ($I_{out}$) is still not constant with respect to the drain voltage ($V_{out}$), and in the saturated region, $dV_d/dV_s$ is in the range from unity to infinity, and the voltage gain can also be controlled in the range from unity to infinity by means of the length of the transistor.

Figure 13:
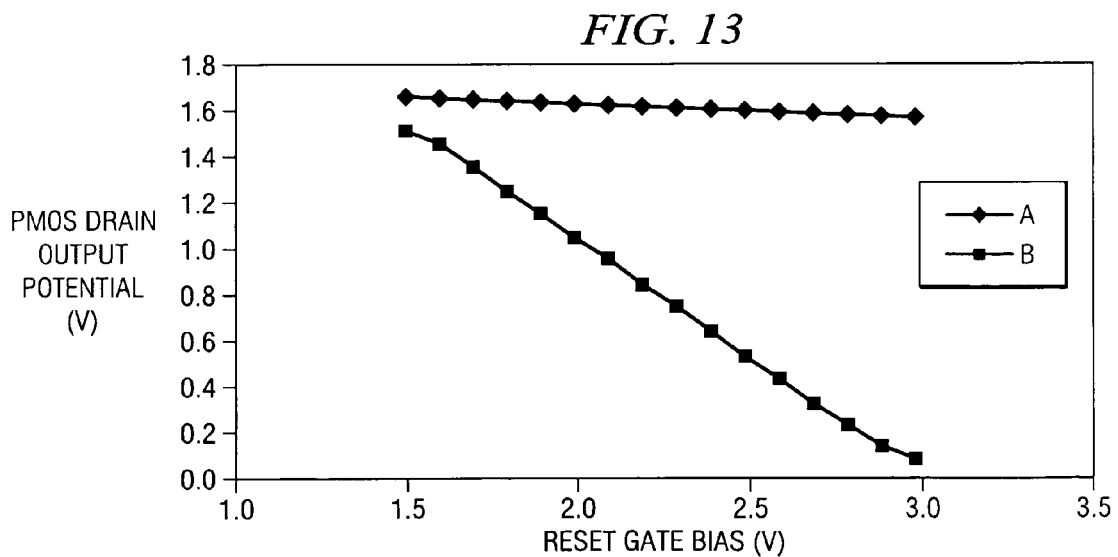
FIG. 13 is a plot of the drain output potential versus the reset gate bias in the CMOS sensor in the second embodiment.

FIG. 13 is a diagram illustrating the drain output potential versus the reset gate bias in the CMOS sensor of the second embodiment. In this figure, the ordinate represents the drain output potential ($V_{out}$) of the PMOS transistor, and the abscissa represents the reset gate bias (the voltage applied to the gate electrode of the transistor for reset). Curve A corresponds to the characteristics in the linear region of operation (with a gate voltage of 0.0 V), and curve B corresponds to the characteristics in the saturated region of operation (with a gate voltage of 0.3 V). In the saturated region, the slope becomes greater, and the voltage gain becomes higher.

Said transition to the saturated region can be controlled by setting the voltage applied to the gate electrode of the transistor for pixel selection at the potential of low voltage L, and by controlling the substrate potential $V_{sub}$ and the charge-detecting current amount. Consequently, as required in operation, it is possible to make a transition to the high-gain mode upon demand by the device.

Because this mode depends on the bias value and gate length of the gate for pixel selection, its application is limited. However, it is believed that this mode can find application in the auto-focus mode or preview mode of digital cameras, etc.

Just as in the first embodiment, the novel charge-detecting method of the CMOS sensor in this embodiment, wherein the charge-detecting current flows in the depth direction, has the advantage that it is free of the problem of kTC noise generation accompanying the reset operation, and the problem of black smear. Also, it is possible to reduce the Johnson noise significantly because a high charge detecting current is adopted. Also, by adopting PMOS transistors in said novel charge-detecting portion, it is possible to solve the problems of the prior art, such as the difficulty in increasing the numerical aperture due to the presence of a contact in the light-receiving portion, the problem of dark current and damage when a silicide process is adopted, and the difficulty in adjusting the impurity concentration in the portion below the silicide. With the same design rule, this invention can realize a higher numerical aperture, and it can realize CMOS with higher sensitivity and higher resolution.

In addition, said PMOS transistor can be used as a means to increase the voltage gain, and to realize a type of CMOS sensor that can have zero kTC noise so that the sensitivity is exceptionally high.

In the prior art CMOS sensor composed of four transistors, four transistors form the amplifier of each pixel (for current amplification only). For a 5-μm cell, the numerical aperture is about 20%, and there are various types of noises, such as dark current noise, kTC noise (reset noise), thermal noise, signal shot noise, fixed pattern noise, etc.

Also, in the prior art CMOS sensor of the MOS gate threshold modulation-type, only one transistor forms the amplifier of each pixel (for current amplification only). For a 5-μm cell, the numerical aperture is about 30%, and there are also various types of noise, such as thermal noise, signal shot noise, fixed pattern noise, etc.

Also, in the prior art CMOS sensor of vertical pnp transistor type, two transistors form the amplifier of each pixel (for current amplification only). For a 5-μm cell, the numerical aperture is about 30%, and there are also various types of noise, such as dark noise, signal shot noise, fixed pattern noise, etc.

On the other hand, in the CMOS sensors described in said two embodiments of this invention, two transistors form the amplifier of each pixel (for both current and voltage amplification). For a 5-μm cell, the numerical aperture is increased to about 60%, and all noise but the fixed pattern noise is eliminated.

As explained above, in the CMOS sensors in said two embodiments of this invention, the contact in the light-receiving portion that is needed in the prior art is not required, the leakage current of the unselected pixels can be reduced, and the element separation region can be significantly reduced.

Also, a vertical pnp transistor (junction transistor) with a charge-detecting current flowing in it can be used as a potential barrier for the accumulated charge, and it is possible to share the gate for pixel selection and the gate for reset. As a result, it is possible to realize a high numerical aperture.

In addition, depending on the direction of flow of the charge-detecting current in the transistor for pixel selection, it can be used as an intra-pixel amplifier.

This invention is not limited to the embodiments.

For example, the explanations above have involved a CMOS sensor of the embodiments. However, this invention also applies to solid-state image sensing devices other than CMOS sensors.

In addition, various other modifications can be made as long as the gist of this invention is observed.

The structure of the solid-state image sensing device of this invention allows elimination of kTC noise, black smear and dark current, enables increasing the numerical aperture, and prevents the problem of insufficient area of the light-receiving portion.

The invention claimed is:

1. A solid-state image sensing device comprising an integration of plural pixels, each of which has a light-receiving portion that receives light and generates and accumulates a signal charge, and has the following parts:
   a semiconductor substrate of the first electroconductive type;
   a semiconductor layer of the second electroconductive type that is formed on the principal surface of said semiconductor substrate;
   a gate electrode for pixel selection formed via a gate insulating film on said semiconductor layer;
   a first semiconductor region of the first electroconductive type that is formed in the outer layer of said semiconductor layer in the light-receiving portion positioned on one side of said gate electrode for pixel selection;
   a second semiconductor region of the first electroconductive type formed deeper than said first semiconductor region in the outer layer of said semiconductor layer in said light-receiving portion wherein the semiconductor substrate, the semiconductor layer of the second electroconductive type and the second semiconductor region form a vertical transistor;
   a third semiconductor region of the first electroconductive type formed in the outer layer of said semiconductor layer on the other side of the gate electrode for pixel selection, and containing an impurity of the first electroconductive type and having an impurity concentration higher than that of said first semiconductor region; further comprising:
   a gate electrode for reset that is formed via a gate insulating film on said semiconductor layer, and
   a fourth semiconductor region of the second electroconductive type that is formed in the outer layer of said semiconductor layer on one side of said gate electrode for reset;
   said first semiconductor region is formed in the outer layer of said semiconductor layer on the other side of said gate electrode for reset;
   said semiconductor layer, said gate electrode for reset, and said fourth semiconductor region form a buried-channel type of transistor for reset, and said signal charge accumulated in said light-receiving portion is evacuated from said light-receiving portion when said transistor for reset operates.

2. The solid-state image sensing device described in claim 1 wherein:
   in said semiconductor layer of said light-receiving portion, light is received and the generated signal charge is accumulated;
   in said light-receiving portion, modulation of the threshold of the junction transistor comprising said semiconductor substrate, said semiconductor layer, and said second semiconductor region is performed by means of the signal charge accumulated in said semiconductor layer.

3. The solid-state image sensing device described in claim 1 wherein
   said gate electrode for pixel selection in one pixel is connected to said gate electrode for reset in the pixel adjacent to said one pixel.

4. The solid-state image sensing device described in claim 1 further comprising
   a fifth semiconductor region of the first electroconductive type, having an impurity of the first electroconductive type and having an impurity concentration higher than that of said first semiconductor region, is formed in the outer layer of said semiconductor layer on the periphery of said first semiconductor region and in the portion other than the portion where said gate electrode for pixel selection and said gate electrode for reset are located.

5. The solid-state image sensing device described in claim 4 further comprising
   a field plate formed, as the gate electrode of a transistor for element separation, via a gate insulating film in the upper layer of the semiconductor layer between adjacent pixels on the outer periphery of said fifth semiconductor region.

6. A type of solid-state image sensing device comprising:
   the solid-state image sensing device has plural pixel rows formed from plural light-receiving elements arranged in a linear configuration, with light-receiving elements in each pixel row arranged offset by about ½ pitch from those in the adjacent rows;
   each said light-receiving element has the following parts:
   a semiconductor layer of a first electroconductive type formed on the principal surface of a semiconductor substrate;
   a gate electrode for read formed via an insulating film on said semiconductor layer on one side of the pixel row;
   a gate electrode for reset formed via an insulating film on said semiconductor layer on the other side of the pixel row;

a first semiconductor region of the second electroconductive type formed in the region between said gate electrode for read and said gate electrode for reset;

a second semiconductor region of the second electroconductive type, having an impurity concentration higher than that of said first semiconductor region and formed on said semiconductor layer in a region nearer said gate electrode for read than said gate electrode for reset in said first semiconductor region;

a third semiconductor region of the second electroconductive type, having an impurity concentration higher than that of said first semiconductor region and formed on said semiconductor layer in the region facing said first semiconductor region with said gate electrode for read sandwiched between them said third semiconductor region and said substrate forming a vertical transistor;

and a fourth semiconductor region of the second electroconductive type, having an impurity concentration higher than that of said semiconductor layer and formed on said semiconductor layer in the region facing said first semiconductor region with said gate electrode for reset sandwiched between them;

said gate electrodes for read and gate electrodes for reset of the facing light-receiving elements in adjacent pixel rows are electrically connected to each other.

7. The solid-state image sensing device described in claim 6 wherein said gate electrodes for read and said gate electrodes for reset of the facing light-receiving elements in the adjacent pixel rows are formed by a single electroconductive layer, and said electroconductive layer is arranged to zigzag between the adjacent pixel rows.

8. The solid-state image sensing device described in claim 7 wherein said first semiconductor regions of the light-receiving elements in the same pixel row are separated from each other by a fifth semiconductor region of the second electroconductive type that has an impurity concentration higher said that of first semiconductor region.

9. The solid-state image sensing device described in claim 7 further comprising a plate electrode formed via an insulating film on said fifth semiconductor region.

10. The solid-state image sensing device described in claim 7 wherein when a first voltage is applied to said gate electrode for reset, said light-receiving element is reset and the charge accumulated in said light-receiving element is evacuated, and when a second voltage is applied to said gate electrode for read, a signal corresponding to the charge accumulated in said light-receiving element is output.

11. The solid-state image sensing device described in claim 7 wherein said first, second and third semiconductor regions have p-type electroconductivity, while said semiconductor layer and said fourth semiconductor region have n-type electroconductivity.

12. The solid-state image sensing device described in claim 6 wherein said first semiconductor regions of the light-receiving elements in the same pixel row are separated from each other by a fifth semiconductor region of the second electroconductive type that has an impurity concentration higher than said that of first semiconductor region.

13. The solid-state image sensing device described in claim 12 further comprising a plate electrode formed via an insulating film on said fifth semiconductor region.

14. The solid-state image sensing device described in claim 13 wherein when a first voltage is applied to said gate electrode for reset, said light-receiving element is reset and the charge accumulated in said light-receiving element is evacuated, and when a second voltage is applied to said gate electrode for read, a signal corresponding to the charge accumulated in said light-receiving element is output.

15. The solid-state image sensing device described in claim 13 wherein said first, second and third semiconductor regions have p-type electroconductivity, while said semiconductor layer and said fourth semiconductor region have n-type electroconductivity.

16. The solid-state image sensing device described in claim 12 wherein when a first voltage is applied to said gate electrode for reset, said light-receiving element is reset and the charge accumulated in said light-receiving element is evacuated, and when a second voltage is applied to said gate electrode for read, a signal corresponding to the charge accumulated in said light-receiving element is output.

17. The solid-state image sensing device described in claim 12 wherein said first, second and third semiconductor regions have p-type electroconductivity, while said semiconductor layer and said fourth semiconductor region have n-type electroconductivity.

18. The solid-state image sensing device described in claim 6 wherein when a first voltage is applied to said gate electrode for reset, said light-receiving element is reset and the charge accumulated in said light-receiving element is evacuated, and when a second voltage is applied to said gate electrode for read, a signal corresponding to the charge accumulated in said light-receiving element is output.

19. The solid-state image sensing device described in claim 6 wherein said first, second and third semiconductor regions have p-type electroconductivity, while said semiconductor layer and said fourth semiconductor region have n-type electroconductivity.

* * * * *